United States Patent
Ishio et al.

(10) Patent No.: US 7,560,921 B2
(45) Date of Patent: Jul. 14, 2009

(54) METHOD AND DEVICE FOR ANALYZING DISTRIBUTION OF COERCIVE FORCE IN VERTICAL MAGNETIC RECORDING MEDIUM USING MAGNETIC FORCE MICROSCOPE

(75) Inventors: Shunji Ishio, Akita (JP); Hitoshi Saito, Akita (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 391 days.

(21) Appl. No.: 11/631,101

(22) PCT Filed: Jun. 15, 2005

(86) PCT No.: PCT/JP2005/010933

§ 371 (c)(1),
(2), (4) Date: Dec. 28, 2006

(87) PCT Pub. No.: WO2006/003789

PCT Pub. Date: Jan. 12, 2006

(65) Prior Publication Data

US 2008/0284422 A1    Nov. 20, 2008

(30) Foreign Application Priority Data

Jun. 30, 2004    (JP)    .............................. 2004-194901

(51) Int. Cl.
G01R 33/02    (2006.01)
(52) U.S. Cl. .................. 324/244; 324/235; 324/238
(58) Field of Classification Search ................. 324/244, 324/252, 235, 238, 260; 250/306, 307, 311
See application file for complete search history.

(56) References Cited

U.S. PATENT DOCUMENTS 5,707,706 A * 1/1998 Fukaya et al. ............ 428/848.1
5,976,661 A * 11/1999 Fukaya et al. ............ 428/848.8

FOREIGN PATENT DOCUMENTS

JP    5 333128    12/1993

(Continued)

OTHER PUBLICATIONS

J. Bai, et al., "Coercivity Map of Perpendicular Patterned CoCrPt Medium Investigated by Using MFM", Phys. Stat. Sol., vol. 201, No. 8, pp. 1662-1665, 2004.

(Continued)

*Primary Examiner*—Jay M Patidar
(74) *Attorney, Agent, or Firm*—Oblon, Spivak, McClelland, Maier & Neustadt, P.C.

(57) ABSTRACT

A coersive force distribution analyzing, apparatus applies a magnetic field substantially perpendicularly to a sample including a perpendicularly magnetically recordable magnetic thin film. While tow-dimensionally moving the sample, the coersive force distribution analyzing apparatus generates a magnetic flux detection signal in response to a leakage flux generated in a magnetic domain on a sample surface. The apparatus applies, to the sample, a first external magnetic field and a second external magnetic field respectively corresponding to a first threshold and a second threshold selected from a hysteresis characteristic corresponding to average magnetization of the sample. This results in first magnetic domain image data and second magnetic domain image data. The apparatus uses the first and second thresholds to binarize the first and second image data to generate a first coersive force distribution pattern corresponding to the difference between the binarized first and second image data.

13 Claims, 7 Drawing Sheets

FOREIGN PATENT DOCUMENTS

| | | |
|---|---|---|
| JP | 9 218213 | 8/1997 |
| JP | 2001 50885 | 2/2001 |
| JP | 2003 344258 | 12/2003 |
| JP | 2004 279099 | 10/2004 |

OTHER PUBLICATIONS

R. D. Gomez, et al., "Magnetic Imaging in the Presence of an External Field: Erasure Process of Thin Film Recording Medium", IEEE Transactions on Magnetics, vol. 31, No. 6, pp. 3346-3348, 1995.

H. W. Van Kesteren, et al., "Scanning Magnetic Force Microscopy on Co/Pt Magneto-Optical Disks", J. Appl. Phys. vol. 70, No. 4, pp. 2413-2422, 1991.

J. Bai, "Coercivity Map in Perpendicular Media Investigated by Using in situ Magnetic Force Microscopy", Journal of Applied Physics, vol. 96, No. 10, pp. 5924-5926, 2004.

* cited by examiner

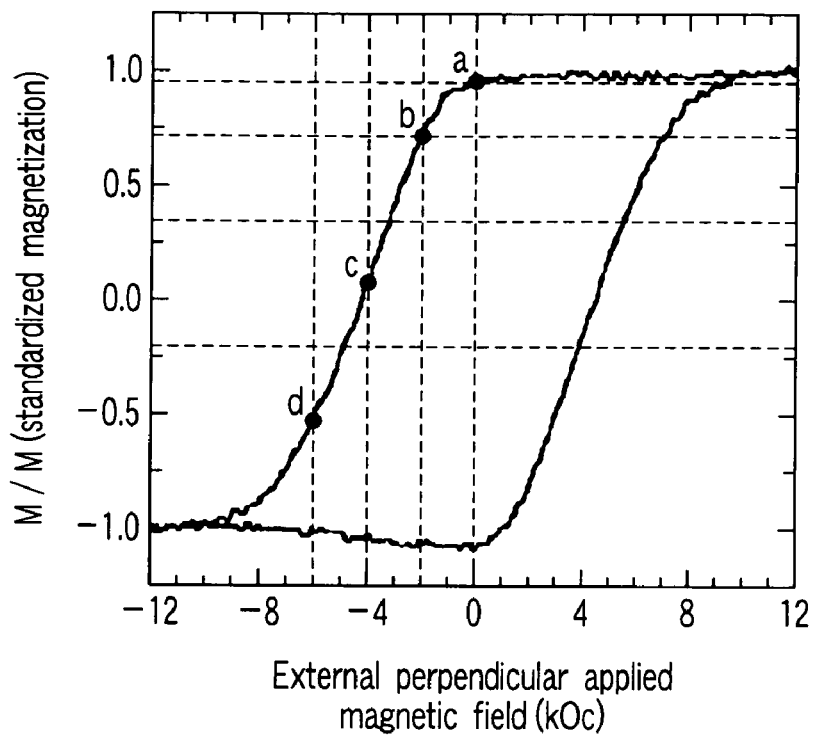
F I G. 3
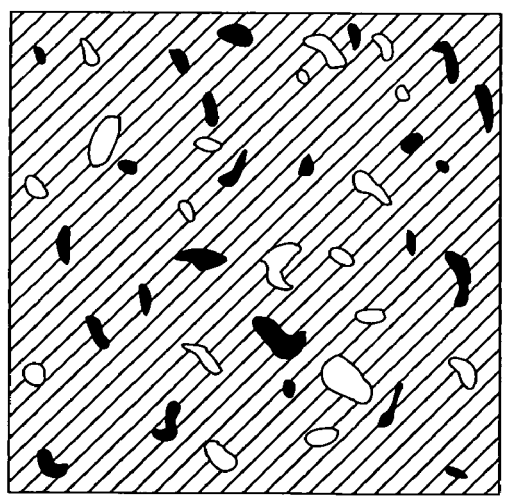
F I G. 4

| Coersive force | Occupied area (%) |
|---|---|
| <1kOe | 5.2 |
| 1~2kOe | 8.5 |
| 2~3kOe | 19 |
| 3~4kOe | 18.2 |
| 4~5kOe | 17.6 |
| 5~6kOe | 15.4 |
| >6kOe | 16.1 |

F I G. 6B

METHOD AND DEVICE FOR ANALYZING DISTRIBUTION OF COERCIVE FORCE IN VERTICAL MAGNETIC RECORDING MEDIUM USING MAGNETIC FORCE MICROSCOPE

CROSS-REFERENCE TO RELATED APPLICATIONS

This is a U.S. National Phase Application under 35 U.S.C. §371 of International Application PCT/JP2005/010933 (not published in English), filed Jun. 15, 2005.

TECHNICAL FIELD

The present invention relates to methods for analyzing the distribution of coersive forces in a perpendicular magnetic recording medium utilizing a magnetic-force microscope, and analyzing apparatuses for the methods, and in particular, to analyzing methods of analyzing image outputs from the magnetic-force microscope to display an image of distribution of coersive forces in the perpendicular magnetic recording medium, and analyzing apparatuses for the methods.

BACKGROUND ART

Conventionally known apparatuses that observe magnetic domains and display their images include magnetic-field observing apparatuses utilizing a magnetic Kerr effect, scanning electron microscopes (spin polarized SEM), and transmission electron microscopes. However, these apparatuses can simply display images of magnetic domains but are not adapted to also display an image of distribution of coersive forces in magnetic domains.

The magnetic-field observing apparatus utilizing the Kerr effect measures coersive forces utilizing the fact that allowing a linearly polarized light beam to impinge on a magnetized recording medium rotates a plane of polarization of the light beam depending on a magnetic field. However, it is difficult for the magnetic-field observing apparatus utilizing the Kerr effect to condense the light beam until its beam spot size becomes of the order of nanometers. Thus, this observing apparatus does not enable magnetic domains to be observed at a nano-scale resolution. This prevents the nano-scale distribution of coersive forces from being determined.

Further, for the observation of magnetic fields, the electron microscope offers as high a resolution as that offered by the magnetic-force microscope. However, the electron microscope basically does not enable measurements in magnetic fields. Accordingly, to determine the distribution of coersive forces, it is necessary to take out a sample for each applied magnetic field to magnetize the sample and insert the sample into a measuring instrument again for measurements. This disadvantageously makes it impossible to measure the sample while directly viewing flux reversal at the same position of the sample to determine the nano-scale distribution of coersive forces.

The magnetic-force microscope (MFM) is known to detect the distribution of magnetism on the surface of the sample and display an image of the distribution as disclosed in, for example, J. Appl. Phys. 70(4), 15 Aug. 1991, P2413-2422, H. W. van Kesteren or Jpn. Pat. Appln. KOKAI Publication No. 2003-344258. The magnetic-force microscope enables magnetic domain structures to be observed on a nano-scale. The magnetic-force microscope (MFM) is known as an apparatus having a magnetic probe at a tip of a cantilever and which utilizes the fact that the magnetic probe is slightly displaced according to the distribution of the magnetism on the sample surface to display an image of the slight displacement to provide an image corresponding to magnetic domains on the sample surface.

In the field of magnetic recording, very high density recording at 400 Gbit/inch$^2$ is generally strongly desired to be achieved within the next 10 years. As a recording scheme for achieving such recording, perpendicular magnetic recording has been energetically studied. Implementation of perpendicular magnetic recording requires a perpendicular magnetic recording medium to be developed which has an easy axis of magnetization in a direction perpendicular to a surface of a recording medium. Further, for implementation of very high density recoding, a reduction in noise in the recording medium is important.

To eliminate the cause of the medium noise, the magnetic domain structure in the medium needs to be precisely controlled. Accordingly, it is essential to clarify the nano-scale distribution of coersive forces in the medium.

The resolution of the magnetic-force microscope (MFM) has already reached a value of 20 nm or less. Further, the magnetic-force microscope can be used to produce and observe samples more easily than the above other techniques for observing magnetic domains. The magnetic-force microscope is thus suitable not only for basic researches but also for developments and researches that require a large number of test samples to be statistically processed. The magnetic-force microscope is actually used for a wide range of material developments including evaluations of magnetic recording media and recording heads, observations of magnetic domains on nano-scale thin films, and observations of magnetic vortices in superconductive materials. However, most of the researches using the conventional magnetic-force microscope are limited to observations of magnetic domain structures. In particular, observations of magnetic domains in magnetic fields are limited to relatively low magnetic fields of at most several kOe.

The magnetic-force microscope (MFM) is a preferable apparatus for displaying an image of the magnetic domain structure of such a perpendicular magnetic recording medium (magnetic thin film). However, the magnetic-force microscope only displays an image of intensities of magnetic fields in magnetic domains. No considerations are given for the additional display of nano-scale distribution of coersive forces. If the nano-scale distribution of coersive forces in the magnetic domain structure can also be displayed, it is expected to be possible to precisely control the magnetic domain structure in the perpendicular magnetic recording medium. This is expected to allow perpendicular recording media with reduced noise to be successfully developed.

Further, to examine a magnetic reversal process that is a process of writing information to a pattern medium, it is desirable to continuously or stroboscopically observe a variation in the magnetic domain structure at the same position of a sample to which a large magnetic field of several kOe is applied.

DISCLOSURE OF INVENTION

An object of the present invention is to provide a method for analyzing the distribution of coersive forces in a perpendicular magnetic recording medium utilizing a magnetic-force microscope that can display an image of nano-scale distribution of the coersive forces in the perpendicular magnetic recording medium.

The present invention provides a coersive force distribution analyzing apparatus comprising:

a magnet device which applies a magnetic field substantially perpendicularly to a sample comprising a perpendicularly magnetically recordable magnetic thin film;

a flux sensing section which generates a flux detection signal in response to a leakage flux generated in a magnetic domain on a surface of the sample;

a moving mechanism which two-dimensionally moves the sample and the flux sensing section relative to each other to allow the flux sensing section to search the sample surface;

a first image generating section which generates magnetic domain image data corresponding to the distribution of magnetic fluxes on the sample surface on the basis of the flux detection signal resulting from the relative movement of the sample;

a setting section which holds a first threshold and a second threshold selected from a hysteresis characteristic corresponding to average magnetization of the sample to set a first external magnetic field and a second external magnetic field corresponding to the first and second thresholds, respectively;

a control section which allows the image generating section to generate first magnetic domain image data while allowing the magnetic device to apply the first external magnetic field to the sample, the control section generating second magnetic domain image data while allowing the magnetic device to apply the second external magnetic field to the sample, the control section further allowing the first and second image generating section to hold the first and second image data; and an image processing section which uses the first and second thresholds to binarize the first and second image data to convert the first and second image data into first binarized image data and second binarized image data, the image processing section comparing the first binarized image data with the second binarized image data to generate a first coersive force distribution pattern corresponding to a difference between the first and second binarized image data.

The present invention also provides a method for analyzing a coersive force distribution, the method comprising:

selecting a first threshold and a second threshold from a hysteresis characteristic corresponding to average magnetization of a sample comprising a perpendicularly magnetically recordable magnetic thin film;

applying a first external magnetic field to the sample and detecting a leakage flux generated in a magnetic domain on the sample while two-dimensionally searching a surface of the sample to allow a first flux detection signal to be generated, generating first magnetic domain image data corresponding to a distribution of magnetic fluxes on the sample surface;

applying a second external magnetic field to the sample and detecting a leakage flux generated in the magnetic domain on the sample while two-dimensionally searching the sample surface to allow a second flux detection signal to be generated, generating second magnetic domain image data corresponding to the distribution of the magnetic fluxes on the sample surface;

using the first and second thresholds to binarize the first and second image data to convert the first and second image data into first binarized image data and second binarized image data, and comparing the first binarized image data with the second binarized image data to generate a first coersive force distribution pattern corresponding to a difference between the first and second binarized image data.

BRIEF DESCRIPTION OF DRAWINGS

FIG. 3 is a graph showing hysteresis curves indicating average normalized magnetization utilized for the analyzing apparatus shown in FIG. 1 and selected average normalized magnetization;

FIG. 4 is a diagram schematically showing an example of an MFM image obtained by the analyzing apparatus shown in FIG. 1;

FIG. 6B is a diagram showing the relationship between coersive force and occupied area in the example of distribution pattern of the inverted magnetic domains mapped on the X-Y coordinate axes obtained by the analyzing apparatus that analyzes the distribution of coersive forces in a perpendicular magnetic recording medium utilizing a magnetic microscope in accordance with the present invention.

BEST MODE FOR CARRYING OUT THE INVENTION

With reference to the drawings, description will be given of a method for analyzing the distribution of coersive forces in a perpendicular magnetic recording medium utilizing a magnetic-force microscope in accordance with the present invention.

Figure 1:
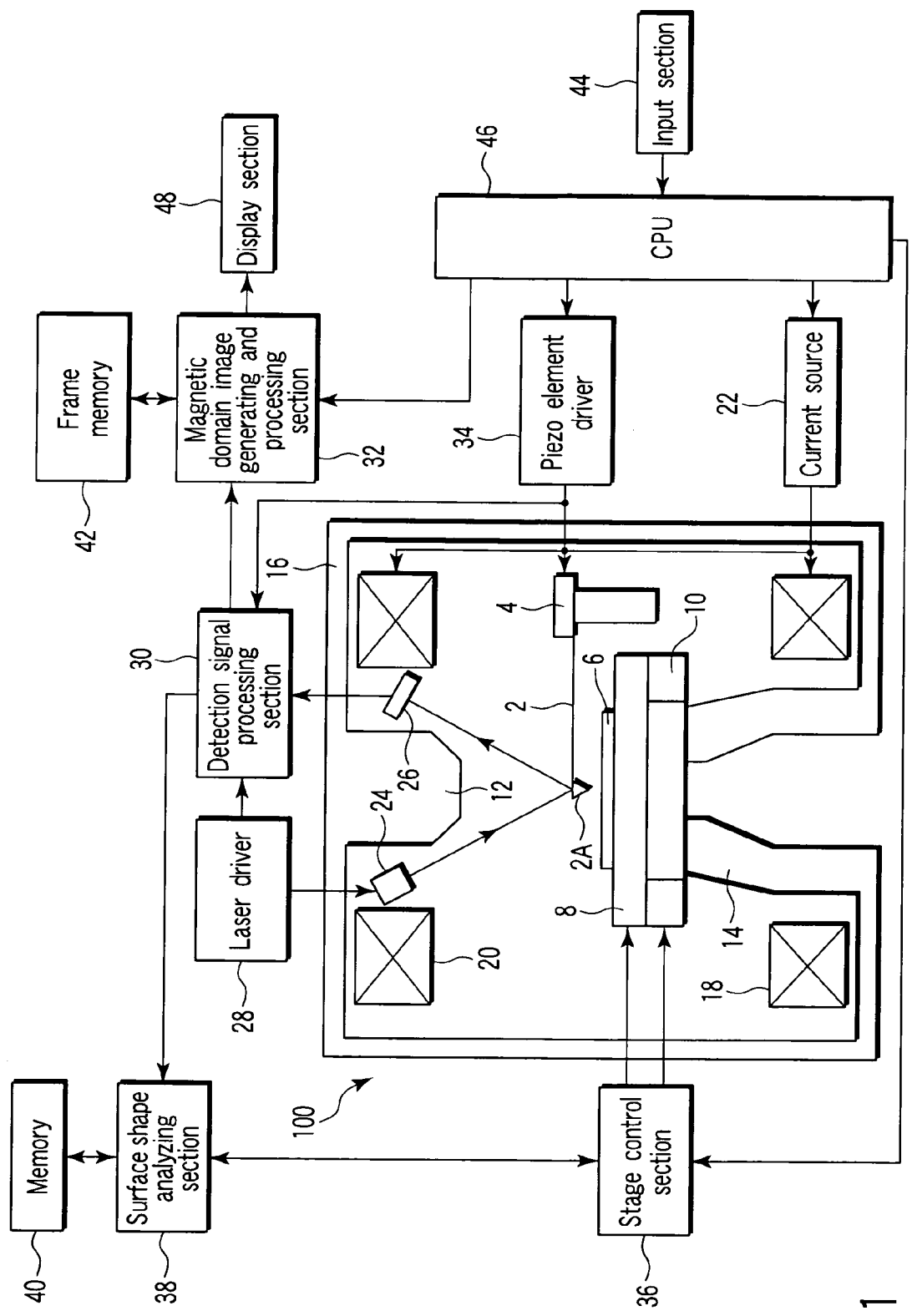
FIG. 1 is a block diagram schematically showing a first embodiment of an analyzing apparatus that utilizes a magnetic-force microscope to analyze the distribution of coersive forces in a perpendicular magnetic recording medium in accordance with the present invention.

FIG. 1 is a block diagram showing an analyzing apparatus that analyzes the distribution of coersive forces in a perpendicular magnetic recording medium utilizing a magnetic-force microscope in accordance with the present invention.

In FIG. 1, reference numeral 100 denotes a magnetic-force microscope having a magnetic field applying function. Reference numeral 2 denotes a cantilever serving as a probing section of the magnetic-force microscope; the cantilever is made of a nonmagnetic substance and has a probe 2A at its free end. The cantilever 2 is vibratorily supported by a piezo element 4, and the probe 2A at the tip of the cantilever is placed on a sample 6. In a magnetic domain observing mode in which the distribution of coersive forces is analyzed, the probe 2A needs to be subjected to an acting force according to the magnetism of a magnetic domain. The probe 2A is thus made of a ferromagnetic material. In a morphology observing mode in which the surface morphology of the sample 6, that is, recesses and protrusions on the surface, is analyzed, the probe 2A needs to be an acting force other than the magnetism which acts between the sample 6 and the probe 2A, for example, an atomic force. The probe 2A is thus a metal piece or the like which is made of a nonmagnetic material. Consequently, the cantilever 2 is removable from the piezo element 4 or from the apparatus together with the piezo element 4. The cantilever 2 can be replaced with one compatible with the observing mode.

The sample 6 comprises a perpendicularly magnetically recordable ferromagnetic thin film, for example, CoCrPt—$SiO^2$ formed on a film-like substrate. The sample 6 is supported on an X-Y stage 8 that slightly moves the sample 6 in an X-Y plane. In terms of magnetic domains, the surface of the sample 6 is normally shaped to have granular recesses and protrusions. To prevent the recesses and protrusions from affecting the analysis of distribution of coersive forces, the surface morphology is preferably observed so that the sample 6 is controlled in a Z direction on the basis of the morphology as described below.

The X-Y stage 8 is supported on a Z stage 10 that slightly moves the sample 6 in the Z direction. Controlling the Z stage 10 enables a first distance to be maintained between the sample 6 and the probe 2A; the first distance is suitable for the morphology observing mode, in which the surface morphology of the sample 6 is observed. Controlling the Z stage 10 also enables a second distance to be maintained between the sample 6 and the probe 2A; the second distance is suitable for the magnetic domain observing mode, in which the magnetic domains of the sample 6 are observed. Normally, the first distance, set in the morphology observing mode, is sufficiently shorter than the second distance, set in the magnetic domain observing mode. Further, the morphology observing mode utilizes the acting force acting between the sample 6 and the probe 2A. This places the probe 2A sufficiently close to the sample 6. In the magnetic domain observing mode, magnetic forces from magnetic domains act further than the acting force (for example, an atomic force) between the sample 6 and the probe 2A. The probe 2A is thus located relatively away from the surface of the sample 6. Further, in the magnetic domain observing mode, controlling the Z stage 10 on the basis of morphology of the surface of the sample 6 enables a substantially fixed distance between the surface of the sample 6 and the probe 2A. Moreover, the magnetic force can be measured with the acting force between the surface of the sample 6 and the probe 2A substantially neglected. The sufficiently flat (in terms of several tens of nanometers) surface of the sample 6 eliminates the need to perform control such that in the magnetic domain observing mode, the Z stage 10 maintains a sufficiently fixed distance between the surface of the sample 6 and the probe 2A.

The piezo element 4 is connected to a piezo element driver 34 and driven in accordance with high-frequency alternating signals supplied by the piezo element driver 34. The magnetic probe 2A at the tip of the piezo element 4 is vibrated up and down on the surface of the sample 6. Further, the X-Y stage 8 and Z stage 10 are connected to a stage control section 36 that drives the Z stage 10 to control the distance between the sample 6 and the magnetic probe 2A to a predetermined distance. Furthermore, the X-Y stage 8 is slightly moved in the X-Y plane by the stage control section 36. Consequently, the sample 6 has its surface scanned by the probe 2A with the fixed distance maintained between the surface of the sample 6 and the probe 2A.

A space in which the sample 6 and cantilever 2 are arranged is kept substantially in a vacuum by an evacuation mechanism (not shown). Further, to eliminate positional drifts during observations, the magnet and its peripheries are cooled by a cooling device and kept at a fixed temperature. That is, the sample 6 and cantilever 2 are kept in an atmosphere at the fixed temperature so as not to thermally vary their own characteristics. Accordingly, the sample 6 is kept in a thermally fixed state during measurements. The above apparatus offers a maximum magnetic field intensity of, for example, ±6 kOe during observations. Further, to prevent a measuring system from being affected by magnetic fields, a sample holder and the probe are fixed to a magnetic-force microscope (MFM) apparatus system composed of a nonmagnetic material.

A first ball piece 12 is placed above and opposite the sample 6. A second ball piece 14 is placed below and opposite the sample 6. A measuring perpendicular magnetic field (external magnetic field) is generated between the first and second ball pieces 12 and 14 to enable the sample 6 to be magnetized or demagnetized.

The magnetic probe 2A is similarly demagnetized or magnetized by the measuring perpendicular magnetic field. Accordingly, the magnetic probe 2A is provided with a coersive force in response to the measuring perpendicular magnetic field. Provided that the measuring perpendicular magnetic field is kept fixed, the magnetic probe is not affected by the measuring perpendicular magnetic field but is subjected to magnetic repulsion or attraction caused only by leakage magnetic fields from the magnetic domains of the sample 6.

The first and second ball pieces 12, 14 are magnetically coupled together by a magnetic yoke 16. Electromagnets 18, 20 are provided around the peripheries of the first and second ball pieces 12, 14, respectively. The electromagnets 18, 20 are connected to a current source 22 and excited by a current from the current source 22. The excitation generates a measuring perpendicular magnetic field with a predetermined magnetic field intensity between the first and second ball pieces 12, 14 as described below.

Displacement of tip of the cantilever 2 is detected in accordance with what is called an optical cantilever scheme. The back surface at the tip of the cantilever 2 is formed into a mirror surface in order to measure the movement of tip of the cantilever 2. The microscope is also provided with a laser 24 that emits laser beams toward the mirror surface and an optical sensor 26 that detects laser beams reflected by the mirror surface of the cantilever 2. The laser 24 is driven by a laser driver 28 to emit laser beams of a given intensity toward the tip of the cantilever 2. Further, detection signals from the optical sensor 26 are output to a detection signal processing section 30. In the morphology measuring mode, in which the surface morphology of the sample 6 is measured, the detection signal processing section 30 outputs, to a surface morphology analyzing section 38, a surface morphology signal having an output level corresponding to recesses and protrusions on the surface of the sample 6. In the magnetic domain observing mode, in which the magnetic domain intensity is detected, the detection signal processing section 30 outputs a magnetic density detection signal corresponding to a leakage flux from a magnetic domain, to a magnetic domain image processing and generating section 32.

The detection signal processing section 30 is supplied with a piezo element driving signal from the piezo element driver 34. The detection signal processing section 30 then compares the driving signal with an output signal from the optical sensor 26 to extract a surface morphology signal and a magnetic intensity detection signal.

In the morphology measuring mode, if the sample 6 is perfectly flat, a fixed force acts between the sample 6 and the probe 2A. The noiseless output signal from the optical sensor 26 has a signal waveform substantially similar to that of the piezo element driving signal. Thus, a surface morphology signal corresponding to flatness is generated. In contrast, in the morphology measuring mode, if the sample 6 has recesses and protrusions, the acting force between the sample 6 and the probe 2A varies to make the waveform of the noiseless output signal from the optical sensor 26 different from that of the piezo element driving signal. Removing the signal waveform corresponding to the piezo element driving signal from the output signal from the optical sensor 26 results in a surface morphology signal corresponding to recesses and protrusions on the sample 6. That is, a comparator or an adder (not shown) provided in the detection signal processing section 30 compares the output signal from the optical sensor 26 with the piezo element driving signal to generate a surface morphology signal corresponding to recesses and protrusions on the sample 6.

Further, in the magnetic domain observing mode, if there is no leakage flux from any magnetic domain of the sample 6 with an external perpendicular magnetic field applied to the sample 6, neither attraction nor repulsion occurs between the magnetic domains and the magnetic probe 2A. Thus, as described above, the noiseless output signal from the optical sensor 26 and the piezo element driving signal have substantially similar signal waveforms. Substantially no magnetic intensity detection signal corresponding to a leakage flux is generated by any magnetic domain. In contrast, in the magnetic domain observing mode, if there is a leakage flux from any magnetic domain of the sample 6 with an external perpendicular magnetic field applied to the sample 6, an attraction or a repulsion occurs between the magnetic domain and the magnetic probe 2A. Removing the signal waveform corresponding to the piezo element driving signal from the optical sensor 26 results in a magnetic intensity detection signal corresponding to the leakage signal from the magnetic domain. That is, as described above, the comparator or adder (not shown), provided in the detection signal processing section 30, compares the output signal from the optical sensor 26 with the piezo element driving signal to generate a magnetic intensity detection signal corresponding to the leakage signal from the magnetic domain. In a physical sense, the action of a leakage flux on the vibrating magnetic probe 2A shifts the mechanical resonance point between the magnetic probe 2A and cantilever 2. The amount of the shift varies depending on the magnitude of the leakage flux. Thus, the signal processing section 30 detects a variation in resonance point and converts it into a magnetic intensity detection signal corresponding to the leakage flux. The signal is supplied to the magnetic domain image processing and generating section 32. The external perpendicular magnetic field includes a zero magnetic field corresponding to the generation of no magnetic field as described below.

The surface morphology signal is supplied to the surface morphology analyzing section 38, which uses X-Y coordinates as a function to convert the surface morphology signal into a signal for recesses and protrusions in a Z direction. The resulting signal is stored in a memory 40. The surface morphology signal stored in the memory 40 is read as the X-Y stage 8 moves in the magnetic domain observing mode. This moves the Z stage 10 up or down. Thus, as described above, the magnetic probe 2A searches the sample 6 along its recesses and protrusions so as to maintain a fixed distance between the magnetic probe 2A and the sample 6.

The magnetic domain image processing and generating section 32 converts an input magnetic intensity detection signal into shade data depending on the level of the magnetic intensity detection signal; the shade data uses X-Y coordinates as a function. The area scanned by the magnetic probe 2A is converted into a shading image. This image data is stored in a frame memory 42 as a frame image for each measuring perpendicular magnetic field. The frame image can be displayed by a display device 48 in accordance with an instruction from an I/O section 44, for example, a keyboard, under the control of CPU 46. The frame image can be output to a printer (not shown) as required.

Further, the shade data is binarized by the magnetic domain image processing and generating section 32 on the basis of a reference residual magnetic flux density selected as a threshold or normalized magnetization (M/Ms). For the binarized image data, a magnetic domain area with a residual magnetic flux density or magnetization greater than the reference or normalized value is converted into a first color (for example, black). A magnetic domain area with a residual magnetic flux density or magnetization smaller than the reference or normalized value is converted into a second color (for example, white). This binarized image data is also stored in the frame memory 42 after processing. The binarized image data is acquired every time the intensity of the external perpendicular magnetic field corresponding to the reference residual magnetic flux density or reference normalized magnetization is changed. The binarized image data is created from measurement data so that the number of the binarized image data corresponds to the preset level of intensity of the external perpendicular magnetic field.

The magnetic domain image processing and generating section 32 extracts two frames of binarized image data involving similar measurement conditions, from the plurality of binarized image data prepared as described above. The magnetic domain image processing and generating section 32 takes the difference between the two frame image data to determine an area corresponding to the difference. The magnetic domain image processing and generating section 32 converts the area into a first coloring area. Similarly, the magnetic domain image processing and generating section 32 extracts another combination of two binarized frame image data involving similar measurement conditions, takes the difference between the two frame image data to determine an area corresponding to the difference, and converts the area into a second coloring area. This operation is repeated to pattern the distribution of coersive forces in the magnetic domains. The magnetic domain areas are differently colored to create one image frame data indicating the coersive force distribution. The image frame data indicating the coersive force distribution is stored in the frame memory 42 and displayed in the display section 48 as described above.

With reference to FIGS. 2 to 6B, a detailed description will be given of a measuring procedure and operations performed by the analyzing apparatus that analyzes the distribution of coersive forces in a perpendicular magnetic recording medium utilizing a magnetic-force microscope as shown in FIG. 1.

Figure 2:
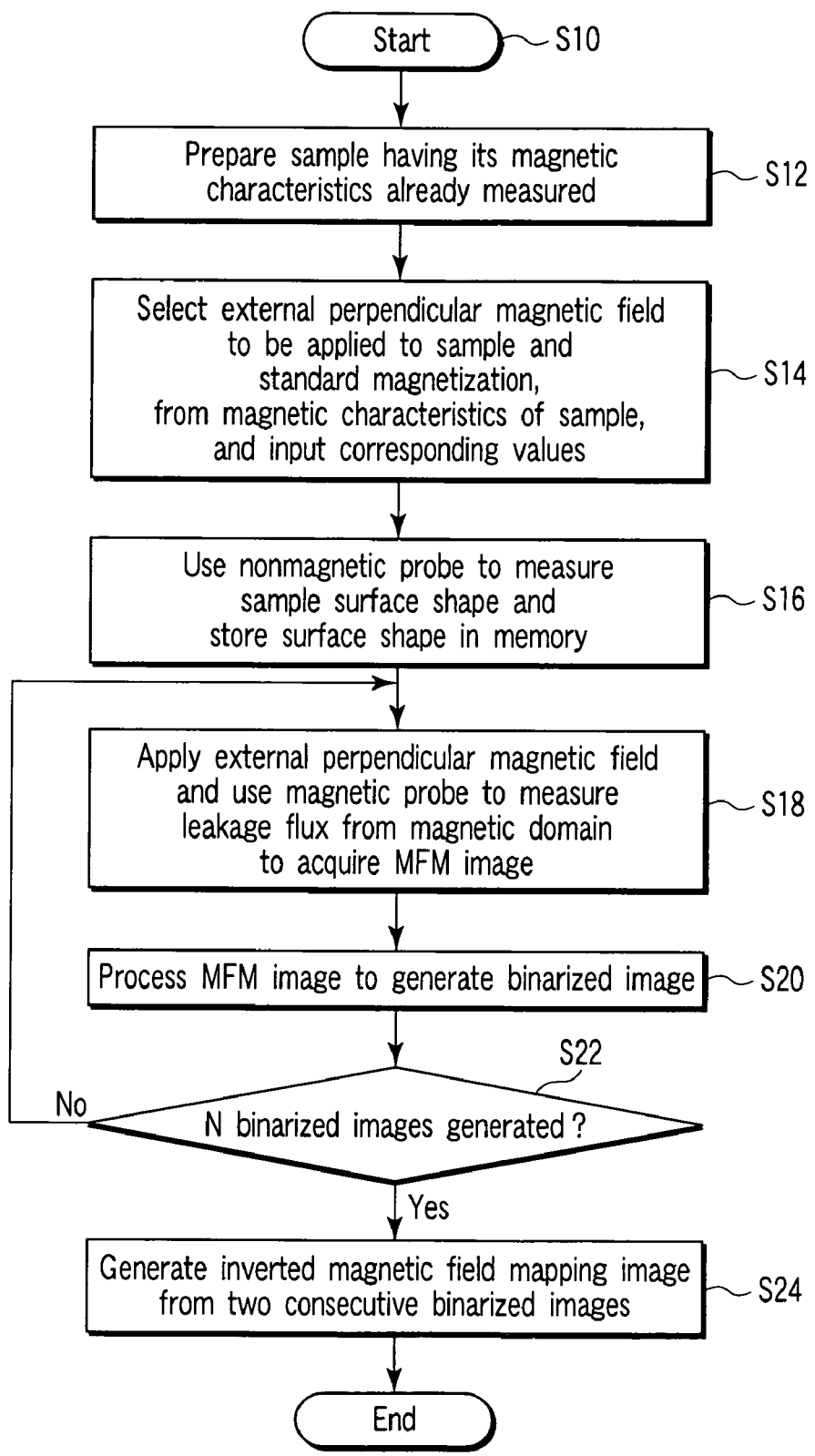
FIG. 2 is a flow chart showing an analyzing method executed by the analyzing apparatus shown in FIG. 1.

As shown in FIG. 2, first, a perpendicular magnetic recording medium (magnetic medium having a magnetic thin film applied to a substrate) as a sample 6 is prepared. Then, as shown in FIG. 2, the average magnetic characteristic (hysteresis characteristic) of the perpendicular magnetic recording medium is measured using a macroscopic magnetization measuring apparatus, for example, a vibration sample magnetometer or a Kerr effect surface magnetization measuring apparatus (steps S10 and S12). Here, the average magnetic characteristic means the average magnetic characteristic of a magnetic substance as a set of a large number of magnetic domains. The average magnetic characteristic is different from that of individual magnetic domains for which the distribution of coersive forces is to be analyzed or of a very small area corresponding to a set of a number of magnetic domains.

The average magnetic characteristic has such a hysteresis curve as shown in FIG. 3, for which at least three, and in the example described below, four normalized magnetization (M/Ms) points are specified. Magnetization images at these points are generated as described below. FIG. 3 shows a hysteresis curve of $CoCrPt$—$SiO_2$, in which the axis of abscissa indicates an external perpendicular applied magnetic field (kOe), whereas the axis of ordinate indicates normalized magnetization (M/Ms ratio). Here, the normalized magnetization indicates the ratio of the magnetic flux density (M) of a magnetic substance based on its saturation magnetic flux density (Ms). The sample 6 prepared is pre-magnetized up to saturation, the external perpendicular applied magnetic field is zero, and the normalized magnetization (M/Ms ratio) is 1. Obviously, although the normalized magnetization is measured in this case, a hysteresis curve of magnetic flux density of coersive forces may be used instead of the hysteresis curve of the normalized magnetization. Alternatively, a known hysteresis curve may be used instead of measurements.

As shown in step S14 in FIG. 2, external perpendicular applied magnetic fields at N points are selected from the hysteresis curve. In this example, four points a, b, c, and d (N=4) are selected. Point a corresponds a first external perpendicular applied magnetic field of zero and a normalized magnetization (M/Ms ratio) of 1. Further, point b corresponds to the demagnetized sample 6 with a second external perpendicular applied magnetic field of −2(kOe) and a normalized magnetization (M/Ms ratio) of substantially 0.7. Moreover, point c corresponds to the demagnetized sample 6 with a third external perpendicular applied magnetic field of −4(kOe) and a normalized magnetization (M/Ms ratio) of substantially zero. Point d corresponds to the demagnetized sample 6 with a fourth external perpendicular applied magnetic field of −6(kOe) and a normalized magnetization (M/Ms ratio) of substantially −0.5. In this case, these four points are selected. However, extraction of the difference between image patterns described below makes it only necessary to select at least two points. Preferably, at least three points are selected to allow the display of an image of distribution of coersive forces in the magnetic domains. Further, when a magnetic substance is used as a recording medium, the external magnetic field is preferably selected so as to obtain a magnetic domain coersive force distribution corresponding to a normalized magnetization (M/Ms ratio) of substantially zero.

The, as shown in step S16, the surface of the sample 6 is searched by a nonmagnetic probe 2A. The surface morphology analyzing section 38 analyzes recesses and protrusions on the sample surface to obtain a Z coordinate using X-Y coordinates as parameters. The Z parameter is then stored in the memory 40 as surface morphology analysis data. The surface morphology analysis data is sufficient to enable the surface morphology to be displayed as an image. The resolution of the surface morphology analysis is preferably equivalent to that of measurements of magnetic forces in the magnetic-force microscope. The surface morphology analysis data is preferably processed by a surface morphology image processing section (not shown) so as to enable the corresponding image to be displayed. Images based on surface morphology analysis data are known as atomic force microscopic images (AFM images) and will thus not be described in detail.

Then, the cantilever 2 with the nonmagnetic probe 2A is replaced with one with a magnetic probe 2A, and measurements are started. Before the measurement, the sample 6 is magnetized up to a normalized magnetization (M/Ms ratio) of 1. The sample 6 magnetized up to the saturation magnetic flux density is held on the X-Y stage 8. As shown in step S18, the leakage flux densities of the surface magnetic domains are measured using the magnetic probe 2A with the measuring external perpendicular applied magnetic field set to zero. The measured magnetic domain area is updated as the X-Y stage 8 moves. Leakage magnetic fluxes are detected one after another using X-Y coordinates indicating the magnetic domain areas as parameters. Magnetic intensity detection signals using the X-Y coordinates as parameters are supplied to the magnetic domain image processing and generating section 32. In this case, the Z stage 10 is moved up or down in response to the recesses and protrusions on the surface of the sample 6. Accordingly, components acting on the magnetic probe 2A in association with the recesses and protrusions on the surface of the sample 6 are removed from the magnetic intensity detection signals.

Predetermined areas of the sample 6 are scanned by the magnetic probe 2A to detect the leakage flux densities of these magnetic domain areas. Then, the magnetic domain image processing and generating section 32 converts the levels of the leakage fluxes into shading image signals (MFM image signals) that use the X-Y coordinates as parameters. Image data (MFM image data) comprising these image signals are stored in the frame memory 42 and displayed in the display section 48 as images (MFM images) in accordance with an instruction from the input section 44. FIG. 4 schematically shows an example of an MFM image. The level of the leakage flux is in proportion to the retained magnetic flux density of the magnetic domain. Accordingly, the image shows the distribution of retained magnetic flux densities of the magnetic domains. In FIG. 4, areas displayed in black indicate magnetic domains with the highest magnetic flux density. Areas displayed in white indicate magnetic domains with the inverted magnetization, the reversed magnetic flux, and the highest magnetic flux density in the opposite direction. The areas between the white and black display areas are shaded. These shaded areas correspond to an intermediate magnetic flux density. In actual images, these areas exhibit different densities because the corresponding magnetic domains have different magnetic flux densities. However, for simplification of the figure, the areas are shown with the single density in FIG. 4.

Figure 5A:
FIG. 5A is a diagram showing an example of a binarized image obtained by binarizing, by means of the selected normalized magnetization, the MFM image obtained by the analyzing apparatus shown in FIG. 1.

Then, each image signal is binarized by the magnetic domain image processing and generating section 32. In this case, the image signal is binarized using the normalized magnetization shown at point (a) in FIG. 3 (M/Ms ratio=1) as a threshold. That is, almost all of the shaded area corresponds to the normalized magnetization (M/Ms ratio=1). Setting this normalized magnetization (M/Ms ratio=1) to be a threshold allows areas with a magnetization equal to or greater than the threshold to be shaded or displayed in black. Accordingly, when such an image signal as shown in FIG. 4 is binarized using the normalized magnetization (M/Ms ratio=1) as a threshold, the shaded and black areas in FIG. 4 are all displayed in black as shown in FIG. 5A. The other areas displayed in white in FIG. 4 are displayed in white against the black background. Thus, in the image in FIG. 5A, the areas displayed in black correspond to magnetic domains magnetized at least the normalized magnetization shown at point (a)

in FIG. 3 (M/Ms ratio=1). The areas displayed in white correspond to magnetic domains magnetized at most the normalized magnetization shown at point (a) in FIG. 3 (M/Ms ratio=1). In other words, even with the average saturation magnetic flux density, the sample 6 has areas shown in white and comprising magnetic domains inverted down to the saturation magnetic flux density or lower and areas shown in black and comprising magnetic domains magnetized up to the saturation magnetic flux density or greater. It should be noted that FIGS. 4 and 5A are only schematically drawn for understanding and do not precisely circumscribe the areas.

As shown in step S22, since N binarized images have not been generated yet, step 18 is executed again. That is, an external perpendicular magnetic field (−2 kOe) is applied to the sample 6 so as to averagely provide the sample 6 with the normalized magnetization shown at point (b) in FIG. 3 (M/Ms ratio≅0.7).

An external perpendicular magnetic field (−2 kOe) is applied to the sample 6. Then, as described above, the predetermined areas of the sample 6 are scanned by the magnetic probe 2A to detect the leakage flux densities of these magnetic domain areas. Then, the magnetic domain image processing and generating section 32 converts the levels of the leakage fluxes into shading image signals (MFM image signals) that use the X-Y coordinates as parameters. Image data (MFM image data) comprising these image signals are stored in the frame memory 42 and displayed in the display section 48 as images (MFM images) in accordance with an instruction from the input section 44 as shown in FIG. 4.

Figure 5B:
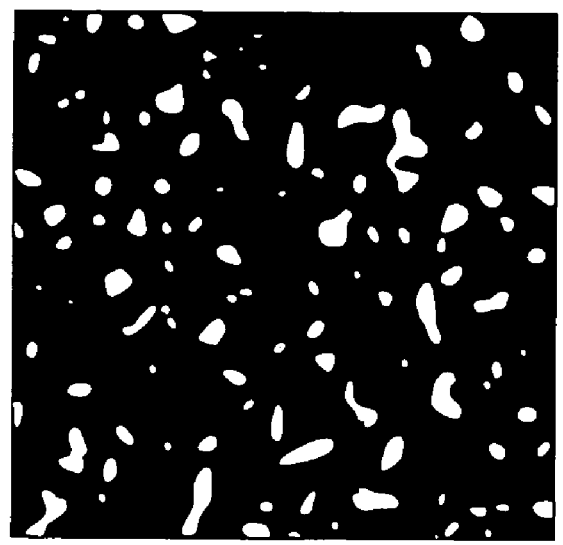
FIG. 5B is a diagram showing an example of a binarized image obtained by binarizing, by means of the selected normalized magnetization, the MFM image obtained by the analyzing apparatus shown in FIG. 1.

Then, each image signal is binarized by the magnetic domain image processing and generating section 32. In this case, the image signal is binarized using the normalized magnetization shown at point (b) in FIG. 3 (M/Ms ratio≅0.7) as a threshold. That is, in an image similar to the one shown in FIG. 4, almost all of the shaded area corresponds to the normalized magnetization (M/Ms ratio≅0.7). Setting this normalized magnetization (M/Ms ratio≅0.7) to be a threshold allows areas with a magnetization equal to or greater than the threshold to be shaded or displayed in black. Accordingly, when such an image signal as shown in FIG. 4 is binarized using the normalized magnetization (M/Ms ratio≅0.7) as a threshold, the shaded and black areas in FIG. 4 are all displayed in black as shown in FIG. 5B. In the image similar to the one shown in FIG. 4, the other areas displayed in white are displayed in white against the black background. Thus, in the image in FIG. 5B, the areas displayed in black correspond to magnetic domains magnetized at least the normalized magnetization shown at point (b) in FIG. 3 (M/Ms ratio −0.7). The areas displayed in white correspond to magnetic domains magnetized at most the normalized magnetization shown at point (b) in FIG. 3 (M/Ms ratio≅0.7). In other words, even with the average magnetization (M/Ms ration≅0.7), the sample 6 has areas shown in white and comprising magnetic domains inverted down to the normalized magnetization (M/Ms ratio≅0.7) or lower and areas shown in black and comprising magnetic domains magnetized up to the normalized magnetization (M/Ms ratio≅0.7) or greater.

The process is repeated until N binarized images are generated as shown in step S22. As shown in step S18, external perpendicular magnetic fields (−4 kOe and −5 kOe) are applied to the sample 6 so that the sample 6 is averagely provided with the normalized magnetizations shown at points (c) and (d) in FIG. 3 (M/Ms ratio≅0 and M/Ms ratio≅0.5).

The external perpendicular magnetic fields (−4 kOe and −5 kOe) are applied to the sample 6. Then, as described above, the predetermined areas of the sample 6 are scanned by the magnetic probe 2A to detect the leakage flux densities of these magnetic domain areas. Then, the magnetic domain image processing and generating section 32 converts the levels of the leakage fluxes into shading image signals (MFM image signals) that use the X-Y coordinates as parameters. Image data (MFM image data) comprising these image signals are stored in the frame memory 42 and displayed in the display section 48 as images (MFM images) in accordance with an instruction from the input section 44 as shown in FIG. 4.

Figure 5C:
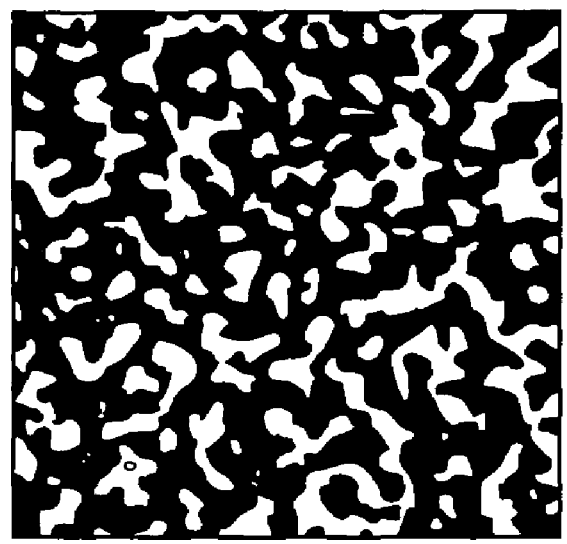
FIG. 5C is a diagram showing an example of a binarized image obtained by binarizing, by means of the selected normalized magnetization, the MFM image obtained by the analyzing apparatus shown in FIG. 1.
Figure 5D:
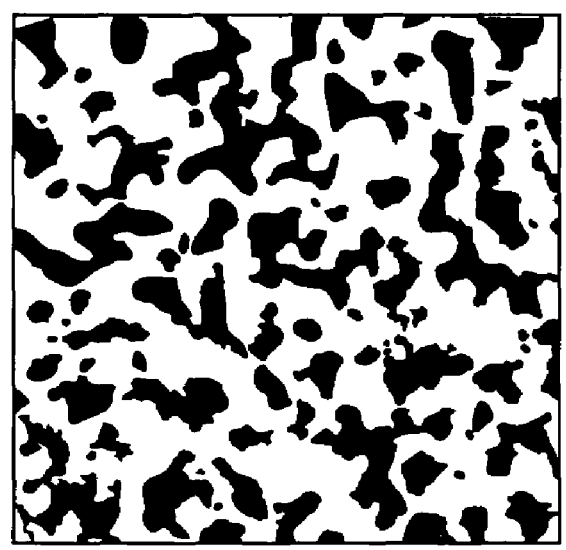
FIG. 5D is a diagram showing an example of a binarized image obtained by binarizing, by means of the selected normalized magnetization, the MFM image obtained by the analyzing apparatus shown in FIG. 1.

Then, each image signal is binarized by the magnetic domain image processing and generating section 32. In this case, the image signal is binarized using the normalized magnetizations shown at points (c) and (d) in FIG. 3 (M/Ms ratio≅0 and M/Ms ratio≅0.5) as thresholds. That is, in an image similar to the one shown in FIG. 4, almost all of the shaded area corresponds to the normalized magnetizations (M/Ms ratio≅0 and M/Ms ratio≅0.5). Setting these normalized magnetizations (M/Ms ratio≅0 and M/Ms ratio≅0.5) to be thresholds allows areas with a magnetization equal to or greater than the threshold to be shaded or displayed in black. Accordingly, when such an image signal as shown in FIG. 4 is binarized using the normalized magnetizations (M/M ratio≅0 and M/Ms ratio≅0.5) as thresholds, the shaded and black areas in FIG. 4 are all displayed in black as shown in FIG. 5D. In the image similar to the one shown in FIG. 4, the other areas displayed in white are displayed in white against the black background. Thus, in the images in FIGS. 5C and 5D, the areas displayed in black correspond to magnetic domains magnetized at at least the normalized magnetizations shown at points (c) and (d) in FIG. 3 (M/Ms ratio≅0 and M/Ms ratio≅0.5). The areas displayed in white correspond to magnetic domains magnetized at most the normalized magnetizations shown at points (c) and (d) in FIG. 3 (M/Ms ratio≅0 and M/Ms ratio≅0.5). In other words, even with the average normalized magnetizations (M/Ms ratio≅0 and M/Ms ratio≅0.5), the sample 6 has areas shown in white and comprising magnetic domains inverted down to the normalized magnetizations (M/Ms ratio≅0 and M/Ms ratio≅0.5) or lower and areas shown in black and comprising magnetic domains magnetized up to the normalized magnetizations (M/Ms ratio≅0 and M/Ms ratio≅0.5) or greater.

Figure 6A:
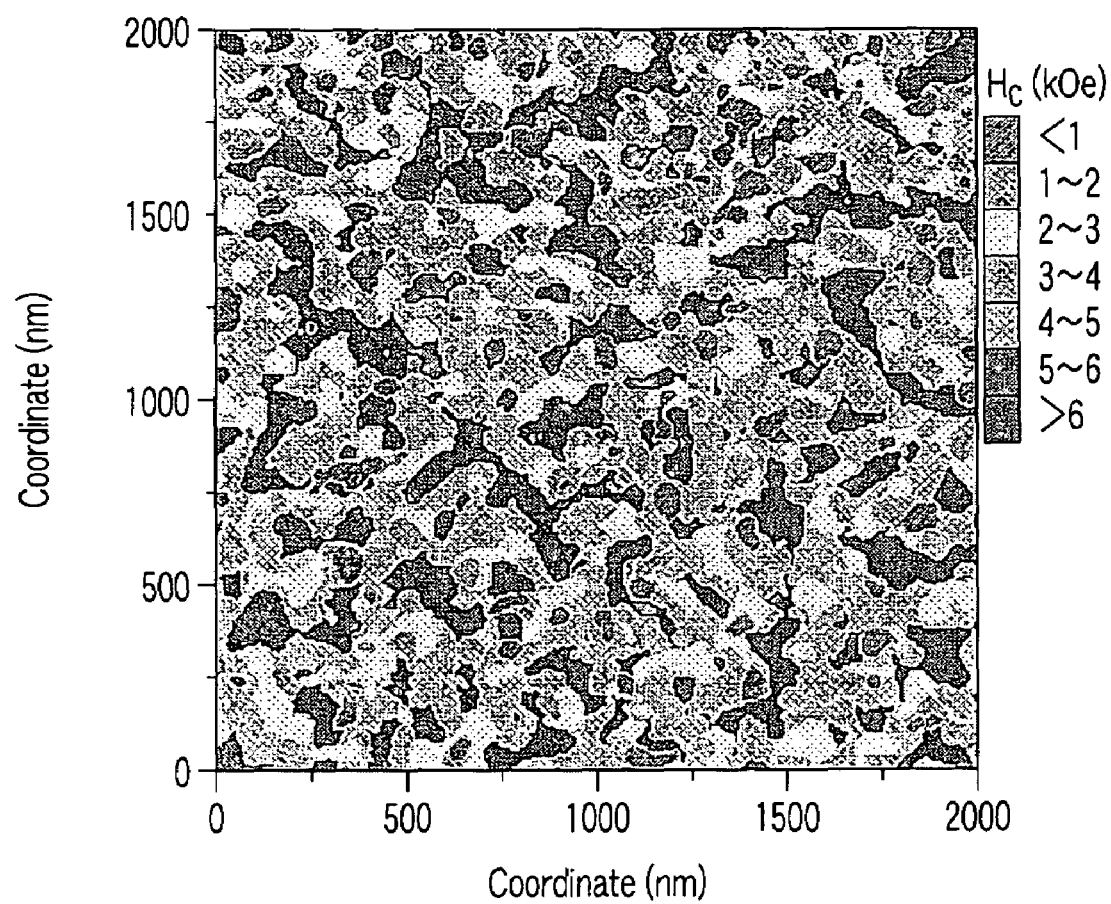
FIG. 6A is a diagram showing an example of distribution pattern of reversed magnetic domains mapped on X-Y coordinate axes obtained by the analyzing apparatus that analyzes the distribution of coersive forces in a perpendicular magnetic recording medium utilizing a magnetic microscope in accordance with the present invention.

The above process results in N (N=4) binarized images. After the generation, the binarized image shown in FIG. 5A is compared with the binarized image shown in FIG. 5B to generate image data corresponding to the difference between these images. For the image corresponding to the difference, only the distribution of data on magnetic domains remains which domains have their retained magnetic flux density switched in response to the switching of the normalized magnetization from M/Ms=1.0 to M/Ms≅0.7 as a result of a change in the value for the external perpendicular magnetic field from zero to (−2 kOe) (during application of an inverted magnetic field). That is, for the image data on the difference, only the distribution pattern of magnetic domains remains which domains have their normalized magnetization switched from M/Ms=1.0 to M/Ms≅0.7 as a result of a change in external perpendicular magnetic field. These magnetic domains actually correspond to the magnetic domains reversed on the basis of a certain normalized magnetization (M/MS=1.0) and are thus called reversed magnetic domains. The distribution pattern of the inverted magnetic domains is mapped to the X-Y coordinate axes, and the inverted magnetic domain areas are displayed in a first color as shown in FIGS. 6A and 6B. Similarly, the binarized image shown in FIG. 5B is compared with the binarized image shown in FIG. 5C to generate image data corresponding to the difference between these images. The distribution pattern of the inverted magnetic domains is mapped to the X-Y coordinate axes, and the inverted magnetic domain areas are displayed in a second color as shown in FIGS. 6A and 6B. In this case, for the image corresponding to the difference, only the distribution of data on magnetic domains remains which domains have their retained magnetic flux density switched in response to the switching of the normalized magnetization from M/Ms≅0.7 to M/Ms≅0 as a result of a change in the value for the external perpendicular magnetic field from (−2 kOe) to (−4 kOe) (during application of an inverted magnetic field). Further, similarly, the binarized image shown in FIG. 5C is compared with the binarized image shown in FIG. 5D to generate image data corresponding to the difference between these images. The distribution pattern of the inverted magnetic domains is mapped to the X-Y coordinate axes, and the inverted magnetic domain areas are displayed in a third color as shown in FIGS. 6A and 6B. In this case, for the image corresponding to the difference, only the distribution of data on magnetic domains remains which domains have their retained magnetic flux density switched in response to the switching of the normalized magnetization from M/Ms≅0 to M/Ms≅0.5 as a result of a change in the value for the external perpendicular magnetic field from (−4 kOe) to (−6 kOe) (during application of an inverted magnetic field). A similar process is repeated for the normalized magnetizations shown at the N points. This results in a diagram of magnetic domain distribution of retained magnetic flux densities displayed in a plurality of colors including but not limited to the first to third colors as shown in FIGS. 6A and 6B. Data on the diagram of magnetic domain distribution of retained magnetic flux densities is stored in the frame memory 42 and displayed in the display section 48 or printed as required.

In the above process, the sample 6 is magnetized up to the positive saturation magnetic flux density and then demagnetized and negatively magnetized by varying the external magnetic field from positive direction to negative direction. Then, the magnetic domain structure resulting from any measuring magnetic field is determined. However, as is apparent from this principle of measurements, it is also possible to magnetize the sample 6 up to a negative saturation magnetic flux density and then varying the external magnetic field from negative direction to positive direction to positively magnetize the sample 6, with the magnetic domain structure resulting from any measuring magnetic field determined.

In the above process, when the measuring magnetic field is defined as Hn (n=1, 2, 3, . . . ), the pattern in the image is displayed in two colors (binarized) in order to allow the image to display the magnetic domains resulting from any magnetic field. That is, the corresponding normalized magnetization (M/Ms) is set to be a threshold so that the magnetic domain areas can be classified into those with magnetizations higher than the normalized magnetization (M/Ms) and those with magnetizations lower than the normalized magnetization (M/Ms). Then, this pattern is displayed in two colors.

Here, it is assumed that the areas displayed in the two different colors indicate upward and downward magnetic domain areas, respectively. For example, it is assumed that bright and dark areas indicate upward and downward magnetic domain areas, respectively.

When the sizes of the upward and downward magnetic domain areas are S↑ and S↓, respectively, (S↑−S↓)/(S↑+S↓) is equal to the normalized magnetization.

For image processing executed by the magnetic domain image processing and generating section, image data is preferably displayed in two colors so that the value (S↑−S↓)/(S↑+S↓) is equal to a value determined by macroscopic magnetization measurements (for example, vibration sample magnetometer or a surface magnetization measuring apparatus based on the Kerr effect). Binarized data is preferably subjected to a calibrating process so as to obtain the average normalized magnetization (M/Ms).

Further, in the above process, the difference between magnetic domain structures resulting from different magnetic fields Hn and $Hn_{+1}$ is determined. Further, the magnetic domain areas inverted between these magnetic fields are determined. These areas are defined as $An-n_{+1}$. The areas $An-n_{+1}$ determined by the differentiating process are measured, and all n images are combined together into a single image. This results in the distribution of coersive forces in the sample.

The apparatus shown in FIG. 1 has been described in conjunction with the mechanism that detects leakage fluxes using the magnetic probe 2A. However, obviously, the present invention is not limited to the magnetic probe and a mechanism may be adopted which uses another optical or electric means to detect leakage fluxes. The mechanism detecting leakage fluxes may be electric detection of distortion of the probe itself, or irradiation of the sample surface with near field light, resulting in rotation of the polarization surface of the near field light on the sample surface owing to the Kerr effect, with the rotation angle detected by a detection system.

As described above, according to the method for analyzing the distribution of coersive forces in a perpendicular magnetic recording medium and the analyzing apparatus for the method in accordance with the present invention, an image of nano-scale distribution of coersive forces in the perpendicular magnetic recording medium can be displayed utilizing a magnetic-force microscope. The magnetic domain structure of the perpendicular magnetic recording medium can thus be determined to reduce noise in the perpendicular magnetic recording medium. This makes it possible to contribute to developing very-high-density recording media.

Further, according to the method for analyzing the distribution of coersive forces and the analyzing apparatus for the method in accordance with the present invention, the magnetization inverting process can be continuously or stroboscopically observed in magnetic fields. Further, an image of distribution of coersive forces in the sample can be obtained on the basis of the difference among image data obtained by various magnetic fields. The image of the coersive force distribution enables a fluctuation in magnetism in a pattern medium or a very-high-density magnetic recording medium to be quantitatively determined. This enables, for example, the direct observation and quantitative evaluation of activation volume.

INDUSTRIAL APPLICABILITY

The present invention provides a method of analyzing image outputs from a magnetic-force microscope to display an image of distribution of coersive forces in a perpendicular magnetic recording medium and an analyzing apparatus for the method. Therefore, the method and apparatus in accordance with the present invention serve to develop perpendicular magnetic recording media and to improve their characteristics.

The invention claimed is:

1. An analyzing apparatus which analyzes a distribution of coersive forces in a sample comprising a perpendicularly magnetically recordable magnetic thin film on a surface of the sample, the apparatus comprising:

a magnet device which applies a magnetic field substantially perpendicularly to the sample surface;

a flux sensing section which generates a flux detection signal in response to a leakage flux generated in a magnetic domain on a surface of the sample;

a moving mechanism which two-dimensionally moves the sample and the flux sensing section relative to each other to allow the flux sensing section to search the sample surface;

a setting section which holds a first threshold and a second threshold selected from a hysteresis characteristic corresponding to average magnetization of the sample to set a first external magnetic field and a second external magnetic field corresponding to the first and second thresholds, respectively;

an image generating section which generates first magnetic domain image data corresponding to the distribution of magnetic fluxes on the sample surface on the basis of the flux detection signal resulting from the relative movement of the sample while allowing the magnet device to apply the first external magnetic field to the sample, the image generating section generating second magnetic domain image data while allowing the magnet device to apply the second external magnetic field to the sample and to hold the first and second image data; and an image processing section which uses the first and second thresholds to binarize the first and second image data to convert the first and second image data into first binarized image data and second binarized image data, the image processing section comparing the first binarized image data with the second binarized image data to generate a first coersive force distribution pattern corresponding to a difference between the first and second binarized image data.

2. The coersive force distribution analyzing apparatus according to claim 1, wherein the setting section sets a third external magnetic field corresponding to a third threshold selected from the hysteresis characteristic, the control section allows the image generating section to generate third magnetic domain image data while allowing the magnet device to apply the third external magnetic field to the sample, and the image processing section uses the third threshold to binarize the third image data to convert the third image data into third binarized image data, and compares the second binarized image data with the third binarized image data to generate a second coersive force distribution pattern corresponding to a difference between the second and third binarized image data.

3. The coersive force distribution analyzing apparatus according to claim 2, wherein the setting section sets a fourth external magnetic field corresponding to a fourth threshold selected from the hysteresis characteristic, the control section allows the image generating section to generate fourth magnetic domain image data while allowing the magnet device to apply the fourth external magnetic field to the sample, and the image processing section uses the third threshold to binarize the fourth image data to convert the fourth image data into fourth binarized image data, and compares the third binarized image data with the fourth binarized image data to generate a third coersive force distribution pattern corresponding to a difference between the third and fourth binarized image data, and maps the first, second, and third coersive force distribution patterns on the same coersive force distribution pattern image data in different colors or at different gray scales.

4. The coersive force distribution analyzing apparatus according to claim 3, wherein the magnetic flux sensing section includes an optical detecting mechanism which optically detects a variation in the magnetic needle to generate a magnetic flux detection signal.

5. The coersive force distribution analyzing apparatus according to claim 4, further comprising a surface morphology detecting section which detects a recess and protrusion morphology of the sample surface to hold surface morphology data on the recess and protrusion morphology, wherein on the basis of the surface morphology data, the moving mechanism moves the sample and the searching section relative to each other in a vertical direction to maintain a fixed distance between the sample surface and the searching section.

6. The coersive force distribution analyzing apparatus according to claim 1, wherein the magnetic flux sensing section includes a magnetic needle which senses a leakage flux from the sample surface and a mechanism which detects displacement of the magnetic needle to generate a magnetic flux detection signal.

7. The coersive force distribution analyzing apparatus according to claim 1, wherein the magnetic flux sensing section includes a searching section which searches the sample surface.

8. A method for analyzing a distribution of coersive forces in a sample comprising a perpendicularly magnetically recordable magnetic thin film on a surface of the sample, the method comprising:

selecting a first threshold and a second threshold from a hysteresis characteristic corresponding to average magnetization of the sample;

applying a first external magnetic field to the sample and detecting a leakage flux generated in a magnetic domain on the sample while two-dimensionally searching a surface of the sample to allow a first flux detection signal to be generated, generating first magnetic domain image data corresponding to a distribution of magnetic fluxes on the sample surface;

applying a second external magnetic field to the sample and detecting a leakage flux generated in the magnetic domain on the sample while two-dimensionally searching the sample surface to allow a second flux detection signal to be generated, generating second magnetic domain image data corresponding to the distribution of the magnetic fluxes on the sample surface;

using the first and second thresholds to binarize the first and second image data to convert the first and second image data into first binarized image data and second binarized image data, and comparing the first binarized image data with the second binarized image data to generate a first coersive force distribution pattern corresponding to a difference between the first and second binarized image data.

9. The method for analyzing a coersive force distribution according to claim 8, further comprising:

selecting a third threshold from the hysteresis characteristic to set a third external magnetic field corresponding to the third threshold, applying a third external magnetic field to the sample and detecting a leakage flux generated in the magnetic domain on the sample while two-dimensionally searching the sample surface to allow a third flux detection signal to be generated, generating third magnetic domain image data corresponding to the distribution of the magnetic fluxes on the sample surface;

using the third threshold to binarize the third image data to convert the third image data into third binarized image data, and compares the second binarized image data with the third binarized image data to generate a second coersive force distribution pattern corresponding to a difference between the second and third binarized image data.

10. The method for analyzing a coersive force distribution according to claim 9, further comprising:
selecting a fourth threshold from the hysteresis characteristic to set a fourth external magnetic field corresponding to the fourth threshold,
applying a fourth external magnetic field to the sample and detecting a leakage flux generated in the magnetic domain on the sample while two-dimensionally searching the sample surface to allow a fourth flux detection signal to be generated, generating fourth magnetic domain image data corresponding to the distribution of the magnetic fluxes on the sample surface;
using the third threshold to binarize the fourth image data to convert the fourth image data into fourth binarized image data, and compares the third binarized image data with the fourth binarized image data to generate a third coersive force distribution pattern corresponding to a difference between the third and fourth binarized image data, and mapping the first, second, and third coersive force distribution patterns on the same coersive force distribution pattern image data in different colors or at different gray scales.

11. The method for analyzing a coersive force distribution according to claim 8, further comprising detecting displacement of a magnetic needle which senses a leakage flux from the sample surface to generate a magnetic flux detection signal.

12. The method for analyzing a coersive force distribution according to claim 11, further comprising optically detecting a variation in the magnetic needle to generate a magnetic flux detection signal.

13. The method for analyzing a coersive force distribution according to claim 8, further comprising:
detecting a recess and protrusion morphology of the sample surface to hold surface morphology data on the recess and protrusion morphology; and
on the basis of the surface morphology data, moving the sample and a searching section which searches the sample relative to each other in a vertical direction to maintain a fixed distance between the sample surface and the searching section.

* * * * *